United States Patent
Chada et al.

(10) Patent No.: US 11,758,647 B2
(45) Date of Patent: Sep. 12, 2023

(54) INHOMOGENEOUS DIELECTRIC MEDIUM HIGH-SPEED STRIPLINE TRACE SYSTEM

(71) Applicant: Dell Products L.P., Round Rock, TX (US)

(72) Inventors: Arun Reddy Chada, Round Rock, TX (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 304 days.

(21) Appl. No.: 17/158,769

(22) Filed: Jan. 26, 2021

(65) Prior Publication Data

US 2022/0240374 A1 Jul. 28, 2022

(51) Int. Cl.
*H05K 1/02* (2006.01)
*H05K 1/03* (2006.01)
*H01P 3/08* (2006.01)

(52) U.S. Cl.
CPC ........... *H05K 1/0245* (2013.01); *H01P 3/085* (2013.01); *H05K 1/0353* (2013.01)

(58) Field of Classification Search
CPC ........... H05K 3/10; H05K 3/103; H05K 3/40; H05K 2201/0776; H05K 2201/09209; H05K 2201/09218; H05K 2201/09227; H05K 2201/09236; H05K 2201/09254; H05K 2201/09709; H05K 1/0228; H05K 1/0239; H05K 1/0242; H05K 1/0245; H05K 1/025; H05K 1/115; H01L 23/64; H01L 23/645; H01L 23/647; H01L 23/66; H01L 23/528

See application file for complete search history.

(56) References Cited

U.S. PATENT DOCUMENTS

| | | | | |
|---|---|---|---|---|
| 6,496,886 B1* | 12/2002 | Osaka | ............... | H05K 1/0239 |
| | | | | 710/100 |
| 8,168,891 B1* | 5/2012 | Goergen | ............... | H05K 1/024 |
| | | | | 174/258 |
| 2009/0242259 A1* | 10/2009 | Ho | ............... | H05K 1/0218 |
| | | | | 29/846 |
| 2014/0158406 A1* | 6/2014 | Kato | ............... | H05K 1/024 |
| | | | | 174/250 |
| 2015/0282300 A1* | 10/2015 | Kagaya | ............... | H05K 1/0245 |
| | | | | 398/135 |
| 2017/0223823 A1* | 8/2017 | Hidaka | ............... | H05K 3/10 |
| 2018/0132344 A1* | 5/2018 | Liao | ............... | H04B 1/00 |

\* cited by examiner

*Primary Examiner* — Timothy J Thompson
*Assistant Examiner* — John B Freal
(74) *Attorney, Agent, or Firm* — Joseph Mencher

(57) ABSTRACT

An inhomogeneous dielectric medium high-speed signal trace system includes a first and second ground layer. A first dielectric layer is located adjacent the first ground layer. A second dielectric layer has a different dielectric constant and a greater thickness than the first dielectric layer, and is located between the first dielectric layer and the second ground layer. A first differential trace pair is located between the first dielectric layer and the second dielectric layer, and includes a trace spacing that is less than or equal to a thickness of the first dielectric layer. The first different trace pair transmit signals and, in response, produces a magnetic field, and the trace spacing prevents a magnetic field strength of the magnetic field from exceeding a magnetic field strength threshold at a second differential trace pair that is located adjacent the first differential trace pair.

20 Claims, 12 Drawing Sheets

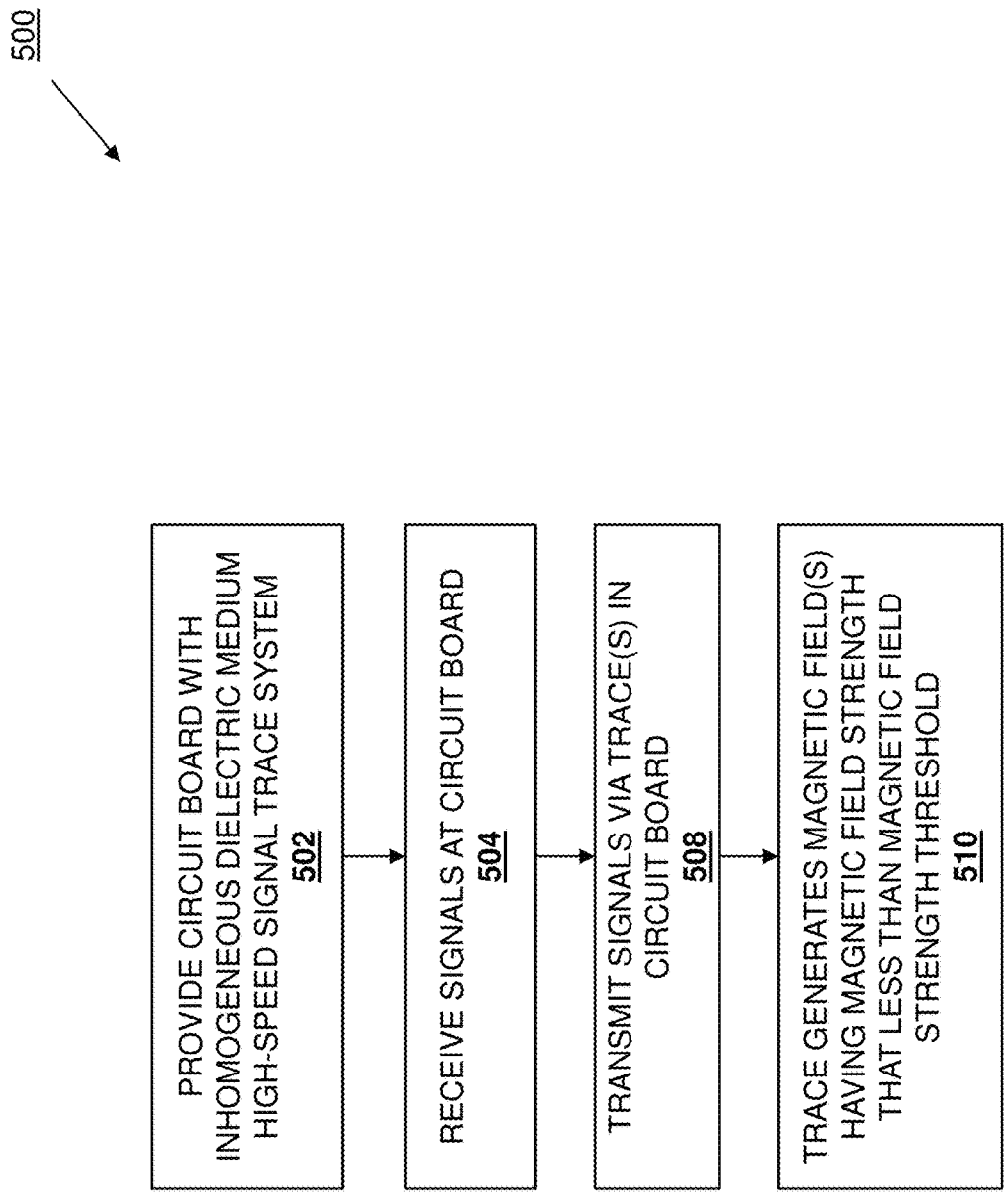

INHOMOGENEOUS DIELECTRIC MEDIUM HIGH-SPEED STRIPLINE TRACE SYSTEM

BACKGROUND

The present disclosure relates generally to information handling systems, and more particularly to providing high-speed stripline traces in an inhomogenous medium in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, storage devices, networking device, desktop computing devices, laptop/notebook computing devices, tablet computing devices, mobile phones, and/or other computing devices known in the art, often include multi-layer printed circuit boards. Such circuit boards often utilize stripline traces, which are data signal transmission line traces suspended in a dielectric medium between two ground layers. For example, a plurality of differential trace pairs may be provided in the circuit board, with each differential trace pair including a pair of stripline traces, in order to allow data signals to be transmitted between components in the computing device using the differential trace pairs. In many embodiments, the dielectric medium in which the different trace pairs are suspended may be provided by a core dielectric layer and a prepreg dielectric layer. For example, the manufacture of the circuit board may include providing a first Copper Clad Layer (CCL) that includes a core dielectric layer sandwiched between a first copper layer and a second copper layer. That first CCL may then have its second copper layer etched to provide differential trace pairs. A second CCL may then be provided that includes a third copper layer (as well as a fourth copper layer/core dielectric layer configured similarly to the first CCL in some examples), and the third copper layer may be adhered to the first CCL (that was etched with the differential trace pairs) using a prepreg dielectric material that provides a prepreg dielectric layer in the circuit board. As such, the circuit board will include the first copper layer and the third copper layer as ground layers, with the differential trace pairs suspended in the dielectric medium provided by the core dielectric layer and the prepreg dielectric layer.

For relatively lower signal transmission frequencies (e.g., 20 GHz and below), the dielectric medium in which the differential trace pairs are suspended may be treated as homogeneous around the traces/differential trace pair. However, that dielectric medium is most often not actually homogeneous due to the dielectric constants of the core dielectric layer and the prepreg dielectric layer differing as a result of, for example, the use of different resins in the core dielectric layer and the prepreg dielectric layer, the use of different glass percentages in the core dielectric layer and the prepreg dielectric layer, and/or other core/prepreg dielectric layer differences that are difficult in practice to match/balance in order to provide a homogenous dielectric medium. As signal transmission speeds increase, the inhomogeneous dielectric medium may cause issues in the circuit board.

For example, the principle operating mode of a stripline trace is transverse electromagnetic (TEM) when the dielectric medium is homogeneous, but becomes quasi-TEM when the dielectric medium is inhomogeneous (e.g., due to the core/prepreg dielectric layer differences discussed above). Furthermore, a quasi-TEM mode can operate to create a potential difference in the ground layers that can produce a parallel plate mode resonance in the ground layers that is a parasitic mode for stripline traces that can affect the signals transmitted thereon, and that parallel pate mode will be more easily produced in the ground layers at portions of stripline traces that have bends or transitions to other layers. The effects of this parasitic parallel plate mode on signals transmitted via stripline traces can be observed in the multiple-tens-of-gigahertz frequency ranges, and results in higher order modes that can cause a divergence of differential-mode and common-mode insertion losses in the circuit board. As such, high-speed stripline traces in an inhomogeneous medium can cause crosstalk noise and signal integrity issues in the circuit board. Conventional solutions to such issues rely on enforcing the balancing/matching of core dielectric layer and prepreg dielectric layer properties, which is particularly difficult when the thicknesses of the core dielectric layer and the prepreg dielectric layer diverge, and requires multiple laminates and circuit board housings to be qualified for the products that will utilize them.

Accordingly, it would be desirable to provide an inhomogeneous dielectric medium high-speed signal trace system that addresses the issues discussed above.

SUMMARY

According to one embodiment, an Information Handling System (IHS) includes a chassis; a processing system that is housed in the chassis; and a board that is housed in the chassis and that supports the processing system, wherein the board includes: a first ground layer; a second ground layer; a first dielectric layer having a first dielectric constant, wherein the first dielectric layer is located adjacent the first ground layer and includes a first thickness and; a second dielectric layer having a second dielectric constant that is different than the first dielectric constant, wherein the second dielectric layer is located between the first dielectric layer and the second ground layer and includes a second thickness that is greater than or equal to the first thickness; and a first differential trace pair that is located between the first dielectric layer and the second dielectric layer and that is coupled to the processing system, wherein the first differential trace pair includes a trace spacing that is less than or equal to the first thickness.

BRIEF DESCRIPTION OF THE DRAWINGS

FIG. 5 is a flow chart illustrating an embodiment of a method for providing high speed signals via stripline traces in an inhomogeneous dielectric medium.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
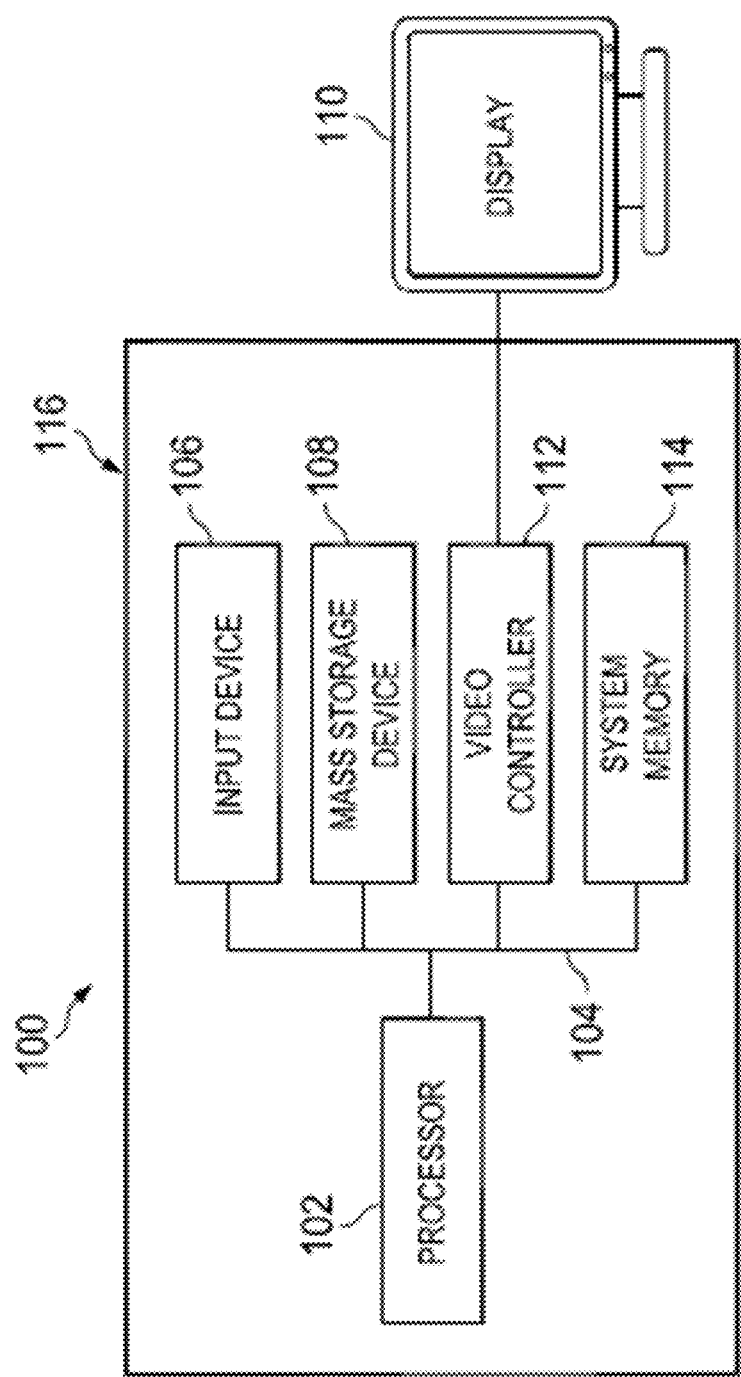
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
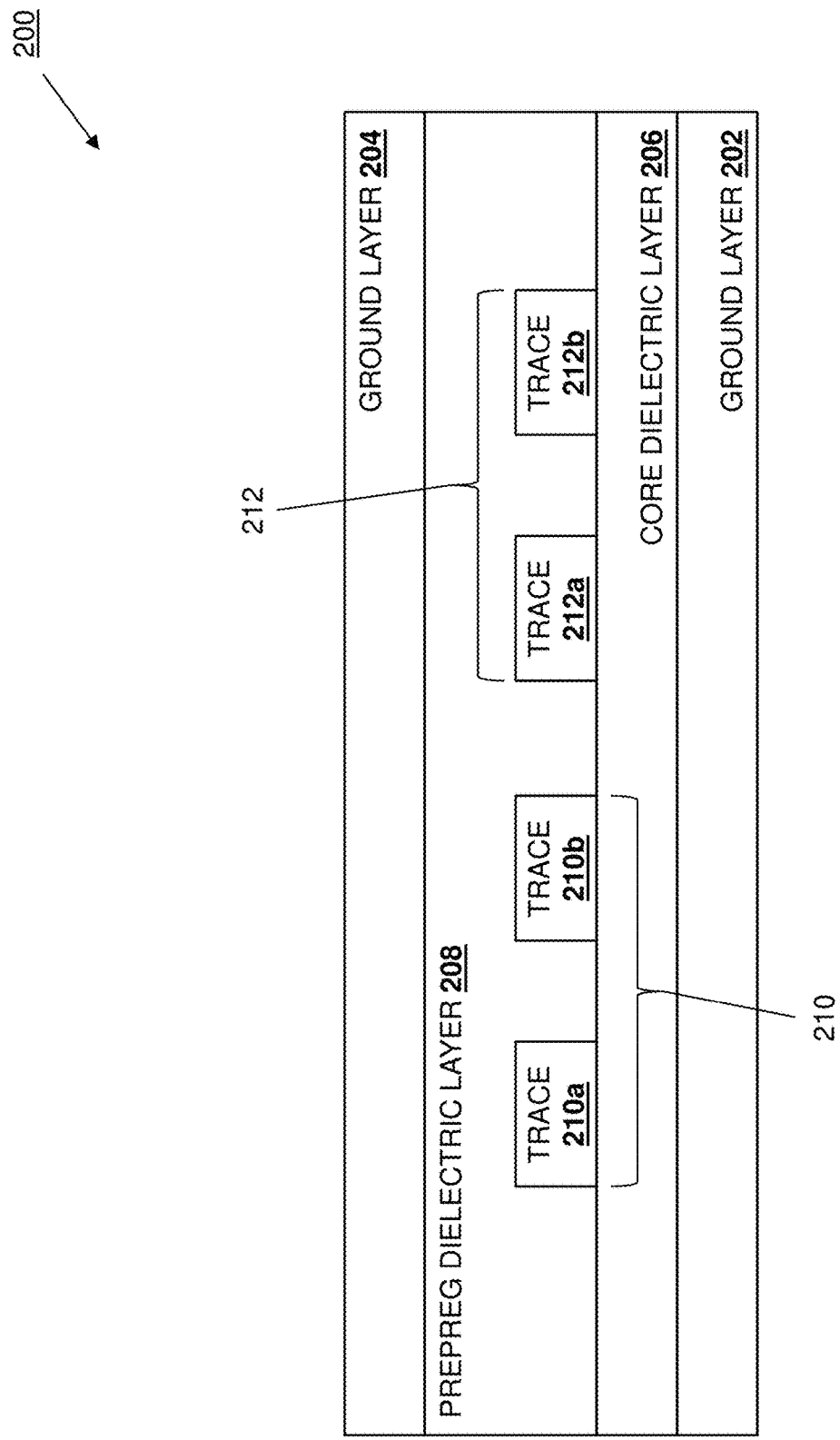
FIG. 2 is a schematic view illustrating an embodiment of a circuit board.

Referring now to FIG. 2, an embodiment of a circuit board 200 is illustrated that is described in some embodiments below as being provided with a convention configuration for purposes of discussing the deficiencies in such conventional configurations, as well as being configured with the inhomogeneous dielectric medium high-speed signal trace system in other embodiments. In the illustrated embodiment, the circuit board 200 includes a pair of ground layers 202 and 204, a dielectric medium between the ground layers 202 and 204 that is provided by a core dielectric layer 206 that engages the ground layer 202 and a prepreg dielectric layer 208 that engages the core dielectric layer 206 and the ground layer 204, and differential trace pairs that are suspended in the dielectric medium between the ground layers 202 and 204 and that are provided in the illustrated embodiment by a differential trace pair 210 with traces 210a and 210b, and a differential trace pair 212 with traces 212a and 212b. While not explicitly illustrated herein, one of skill in the art in possession of the present disclosure will recognize how a processing system (e.g., the processor 102 discussed above with reference to FIG. 1), a memory system (e.g., the system memory 114 discussed above with reference to FIG. 1), and/or other components may be mounted to and/or otherwise coupled to the circuit board, and communicatively connected together by the differential trace pairs 210 and 212 (e.g., the processing system may be coupled to the memory system or other components via one or more differential trace pairs).

For example, the manufacture of the circuit board 200 may include providing a first Copper Clad Layer (CCL) that includes a core dielectric layer sandwiched between a first copper layer and a second copper layer. That first CCL may then have its second copper layer etched to provide the differential trace pairs 210 and 212. A second CCL may then be provided that includes a third copper layer (as well as a fourth copper layer and core dielectric layer similar to the first CCL in some examples), and the third copper layer may be adhered to the first CCL (that was etched with the differential trace pairs 210 and 212) using a prepreg dielectric material that provides the prepreg dielectric layer 208. As such, the circuit board 200 will include the first copper layer and the third copper layer as ground layers 202 and 204, respectively, with the differential trace pairs 210 and 212 suspended in the dielectric medium provided by the core dielectric layer 206 and the prepreg dielectric layer 208. However, while a specific portion of a circuit board 200 has been illustrated and described, one of skill in the art in possession of the present disclosure will recognize that circuit boards provided with a conventional configuration and/or with the inhomogeneous dielectric medium high-speed signal trace system of the present disclosure may include a variety of components and component configurations (e.g., additional layers, etc.) while remaining within the scope of the present disclosure as well.

Figure 3:
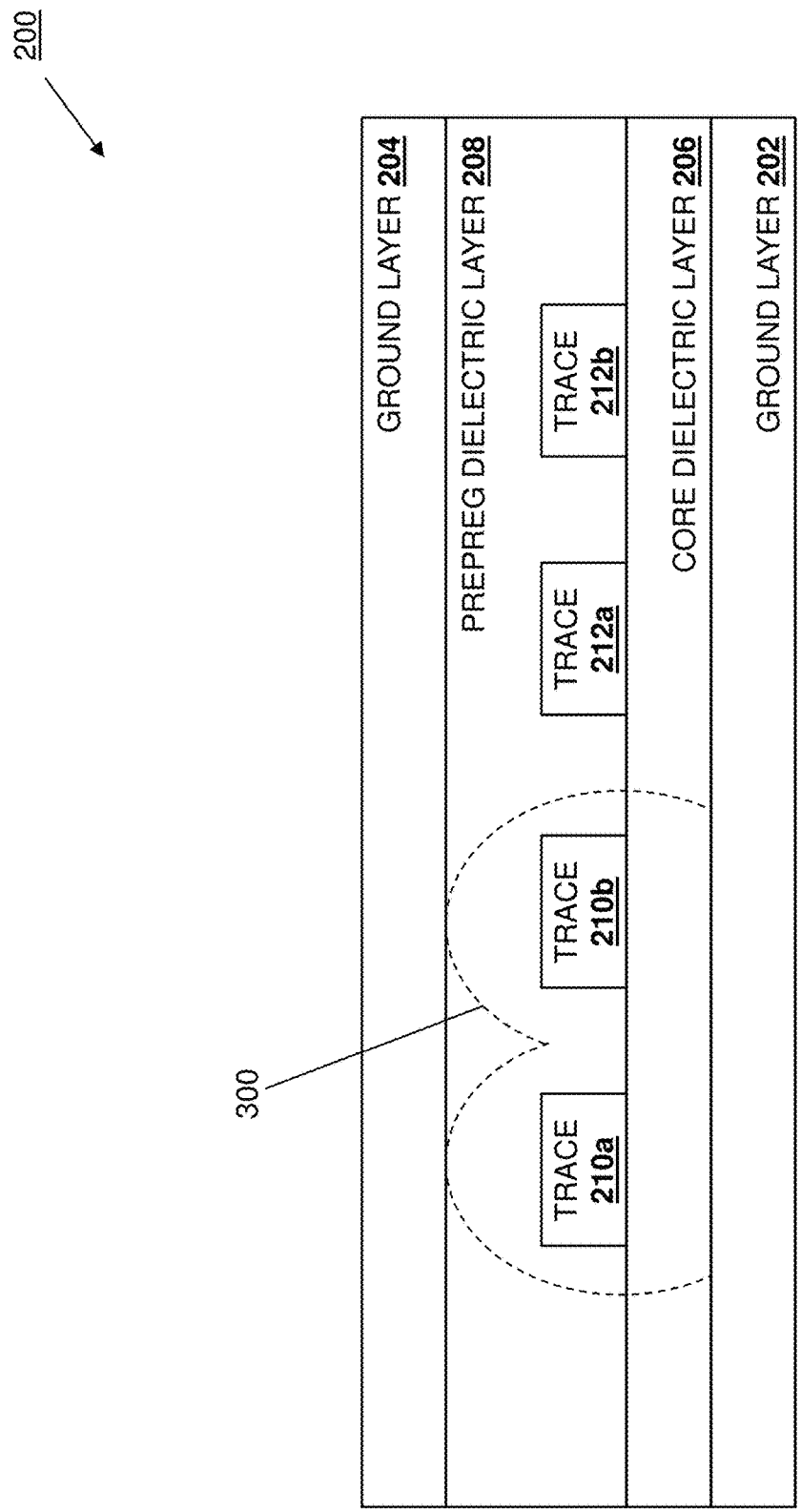
FIG. 3 is a schematic view illustrating an embodiment of the operation of the circuit board of FIG. 2 provided with a conventional configuration.

Referring now to FIG. 3, an embodiment of the operation of the circuit board 200 when it is provided with a conventional configuration is illustrated. In the embodiment illustrated in FIG. 3, the dielectric medium provided by the core dielectric layer 206 and the prepreg dielectric layer 208 may be treated as homogeneous due to, for example, the balancing/matching of core dielectric layer/prepreg dielectric layer constituents (e.g., resins, glass percentages, etc.) and/or the transmission of relatively lower frequency signals (e.g., under 20 GHz in the examples below). As illustrated in FIG. 3, the transmission of data signals using the differential trace pair 210 (when the dielectric medium provided by the core dielectric layer 206 and the prepreg dielectric layer 208 may be treated as homogeneous) produces magnetic field(s) 300 around the traces 210a and 210b that are relatively contained in that the strength of those magnetic field(s) reduces below a magnetic field strength threshold at a distance from the traces 210a and 210b (illustrated by a dashed line in FIG. 3) that does not reach the neighboring differential trace pair 212. As discussed above, the principle operating mode of a stripline trace is transverse electromagnetic (TEM) when the dielectric medium is homogeneous and, as such, the parallel plate mode of the ground layers 202 and 204 would be orthogonal to the TEM mode and thus not excited by that TEM mode, thus providing for the relatively "contained" magnetic field(s) 300.

Figure 4A:
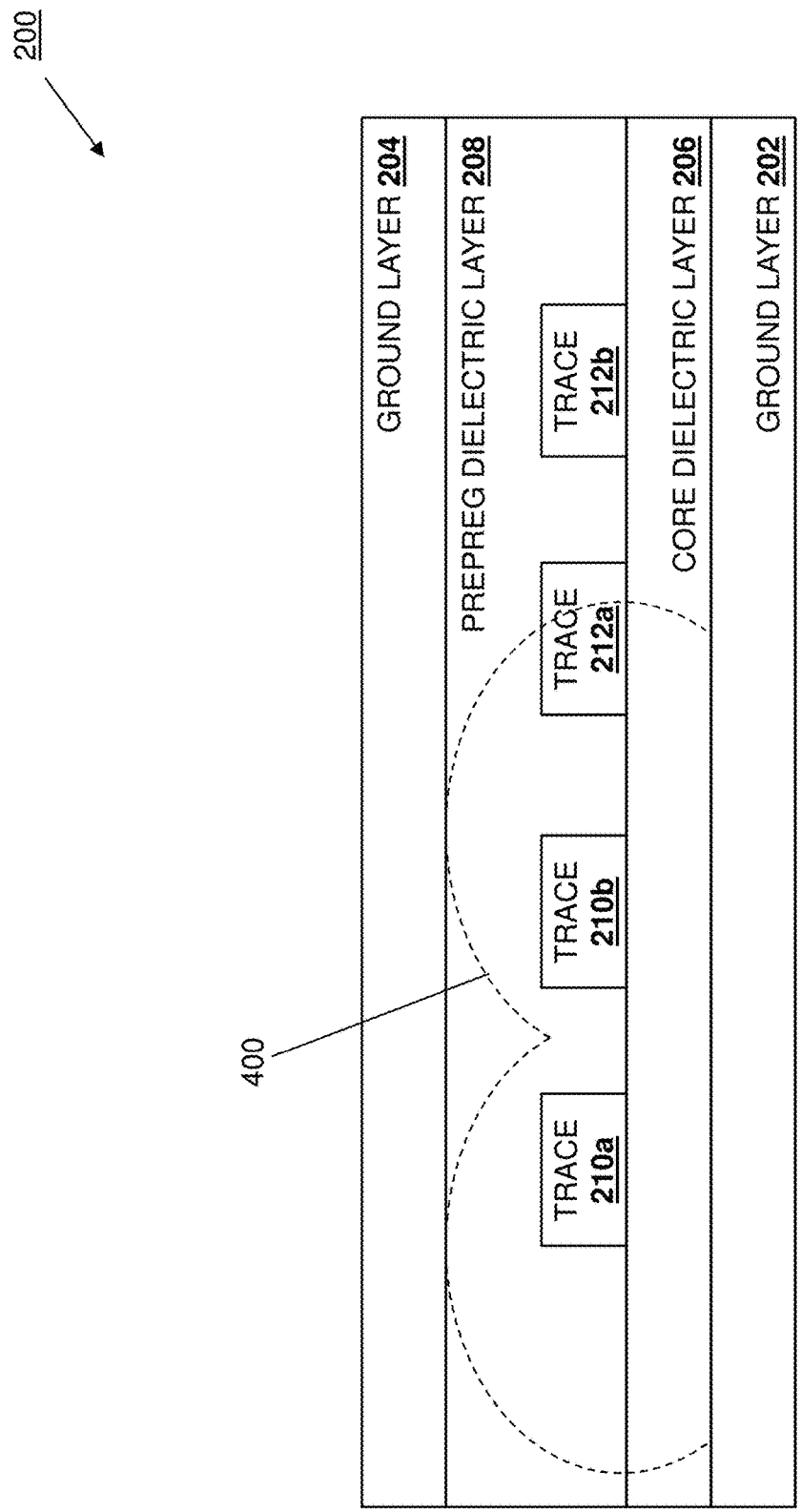
FIG. 4A is a schematic view illustrating an embodiment of the operation of the circuit board of FIG. 2 provided with a conventional configuration.

However, as also discussed above, the dielectric medium provided by the core dielectric layer 206 and the prepreg dielectric layer 208 may be treated as inhomogeneous due to, for example, the inability to balance/match the core dielectric layer/prepreg dielectric layer constituents (e.g., resins, glass percentages, etc.) and/or the transmission of relatively higher frequency signals (e.g., above 20 GHz in the examples below). With reference to FIG. 4A, the transmission of data signals using the differential trace pair 210 (when the dielectric medium provided by the core dielectric layer 206 and the prepreg dielectric layer 208 is treated as inhomogeneous) produces magnetic field(s) 400 around the traces 210a and 210b that are relatively uncontained and that experience "spreading" in that the strength of those magnetic field(s) is above a magnetic field strength threshold at a distance from the traces 210a and 210b (illustrated by a dashed line in FIG. 3) that reaches the neighboring differential trace pair 212 (e.g., the trace 212a in FIG. 4A).

As discussed above, the principle operating mode of a stripline trace is quasi-TEM when the dielectric medium is inhomogeneous (e.g., due to the core/prepreg dielectric layer differences discussed above), and the quasi-TEM mode can operate to create a potential difference in the ground layers that can produce the parallel plate mode resonance discussed above that is a parasitic mode for stripline traces. For example, electric fields in the core dielectric layer 206 and the prepreg dielectric layer 208 (e.g., that provide the inhomogeneous dielectric medium) will have different wave speeds, and as waves propagate in their propagation direction, the phase difference between the electric fields in the core dielectric layer 206 and the prepreg dielectric layer 208 will increase. As will be appreciated by one of skill in the art in possession of the present disclosure, that increasing electric field phase difference may operate to excite the parallel plate mode in the ground layers 202 and 204 that may then impact signals transmitted by the differential trace pairs 210 and/or 212.

Figure 4B:
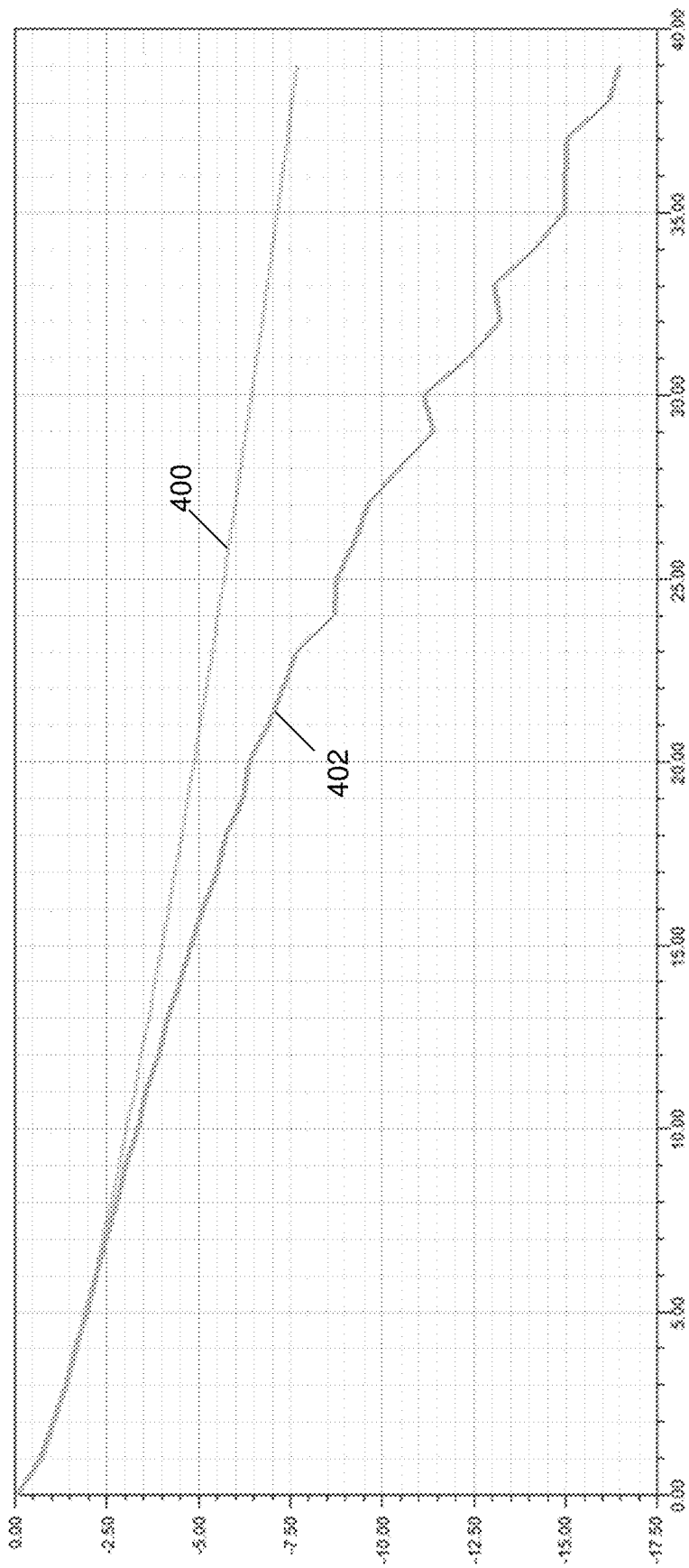
FIG. 4B is a graph view illustrating an embodiment of the operation of the circuit board of FIG. 2 provided with a conventional configuration.
Figure 4C:
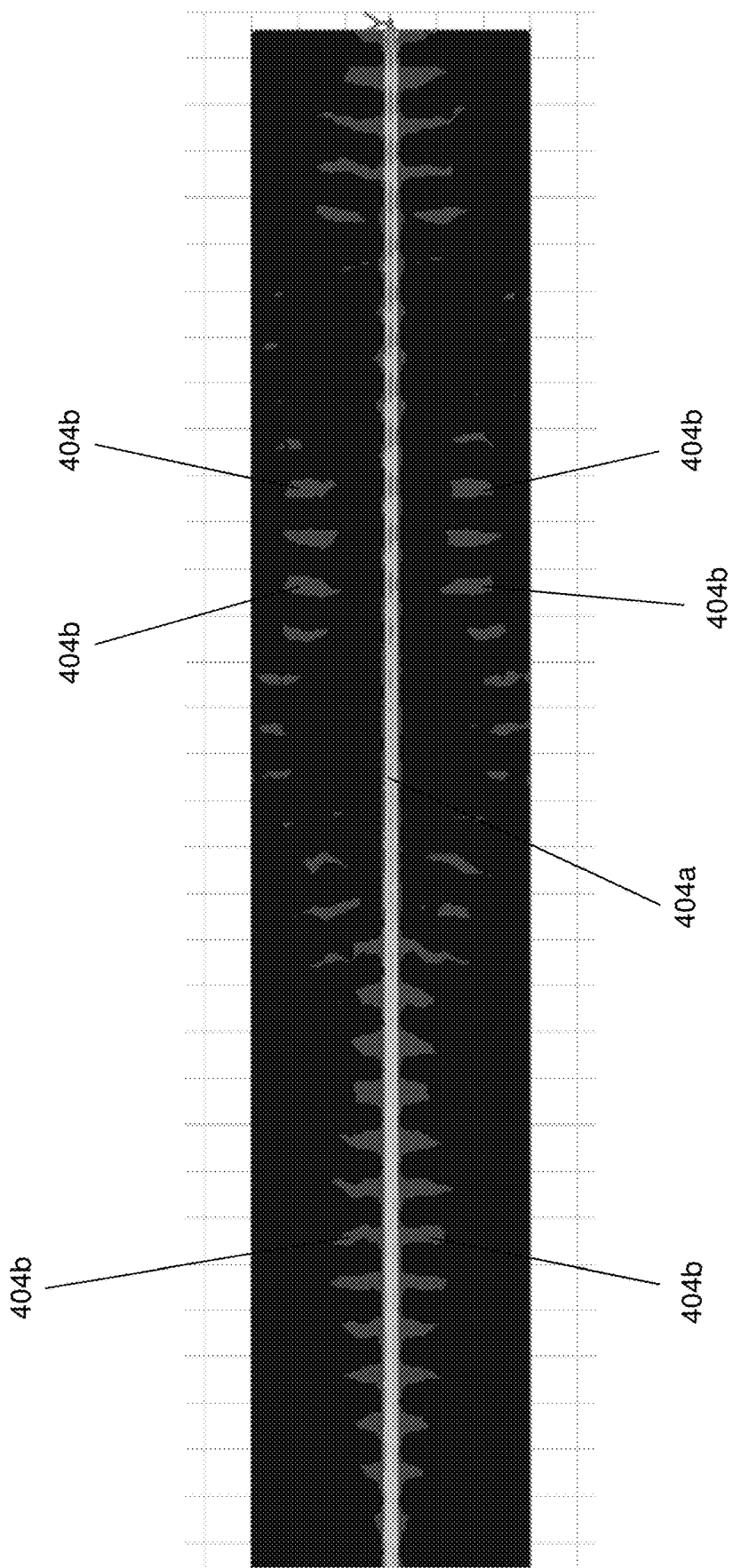
FIG. 4C is a graph view illustrating an embodiment of the operation of the circuit board of FIG. 2 provided with a conventional configuration.
Figure 4D:
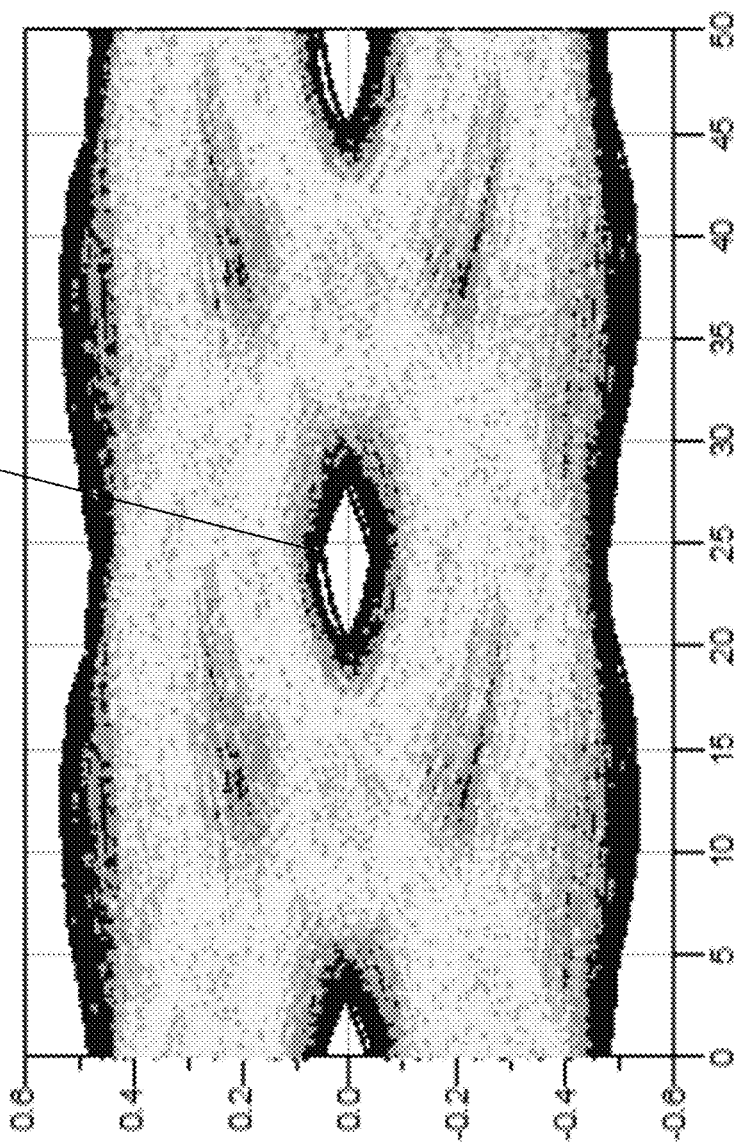
FIG. 4D is a graph view illustrating an embodiment of the operation of the circuit board of FIG. 2 provided with a conventional configuration.

As illustrated in FIG. 4B, the effects of the parasitic parallel plate mode on signals transmitted via stripline traces can be observed in the multiple-tens-of-gigahertz frequency ranges, and results in higher order modes that can cause a divergence of differential-mode insertion losses 400 and common-mode insertion losses 402 in the circuit board (e.g., a divergence which begins at approximately 8 GHz and becomes relatively significant at approximately 20 GHz and above in FIG. 4B). As such, a stripline trace in an inhomogeneous medium that transmits a relatively high-speed signal (e.g., the trace 210b in the circuit board 200 in the example of FIG. 4A) can product a magnetic field that can cause crosstalk noise and other signal integrity issues in the circuit board (e.g., in the trace 212a in the circuit board 200 in the example of FIG. 4A). FIG. 4C illustrates the magnetic field(s) produced by the differential trace pair 210 in FIG. 4A (with the differential trace pair 210 modeled as running from right to left in FIG. 4C), with a portion 404a of the magnetic field(s) centered around the differential trace pair 210, and portions 404b of the magnetic field(s) uncontained and experiencing "spreading" on either side of the differential trace pair 210 (e.g., with a magnetic field strength that exceeds a magnetic field strength threshold). FIG. 4D illustrates an eye diagram 406 for the trace 212a in FIG. 4A with an eye 406a that, as discussed below, is relatively degraded due to the crosstalk noise and/or other signal integrity issues produced by the magnetic field(s) 400 provided by the differential trace pair 210. As such, one of skill in the art in possession of the present disclosure will appreciate that the provisioning of differential trace pairs in a inhomogeneous dielectric medium between a pair of ground layers can excite a parallel plate mode in those ground layers when transmitting relatively high speed signals, and that parallel plate mode can propagate through the ground layers and couple to the traces in the differential trace pairs, causing cross talk noise and/or other signal integrity issues known in the art.

Referring now to FIG. 5, an embodiment of a method 500 for providing high speed signals via stripline traces in an inhomogeneous dielectric medium is illustrated. As discussed below, the systems and methods of the present disclosure provide for the configuration of differential trace pairs in an inhomogeneous dielectric medium between ground layers in a manner that reduces parallel plate mode conversions by those ground layers when relatively high-speed signals are transmitted by those differential trace pairs. For example, the inhomogeneous dielectric medium high-speed signal trace system of the present disclosure may include a first and second ground layer. A first dielectric layer is located adjacent the first ground layer. A second dielectric layer has a different dielectric constant and a greater thickness than the first dielectric layer, and is located between the first dielectric layer and the second ground layer. A first differential trace pair is located between the first dielectric layer and the second dielectric layer, and includes a trace spacing that is less than or equal to a thickness of the first dielectric layer. The first different trace pair transmits signals and, in response, produces a magnetic field, and the trace spacing of the first differential trace pair prevents a magnetic field strength of the magnetic field from exceeding a magnetic field strength threshold at a second differential trace pair that is located adjacent the first differential trace pair. As discussed below, the inhomogeneous dielectric medium high-speed signal trace system of the present disclosure only allows the magnetic field(s) to couple between the traces in the differential trace pair producing them, thus minimizing parallel plate mode conversions by the ground layers, reducing crosstalk with neighboring differential trace pairs, reducing electromagnetic interference (EMI) radiation by the circuit board, and providing other benefits that would be apparent to one of skill in the art in possession of the present disclosure.

Figure 6:
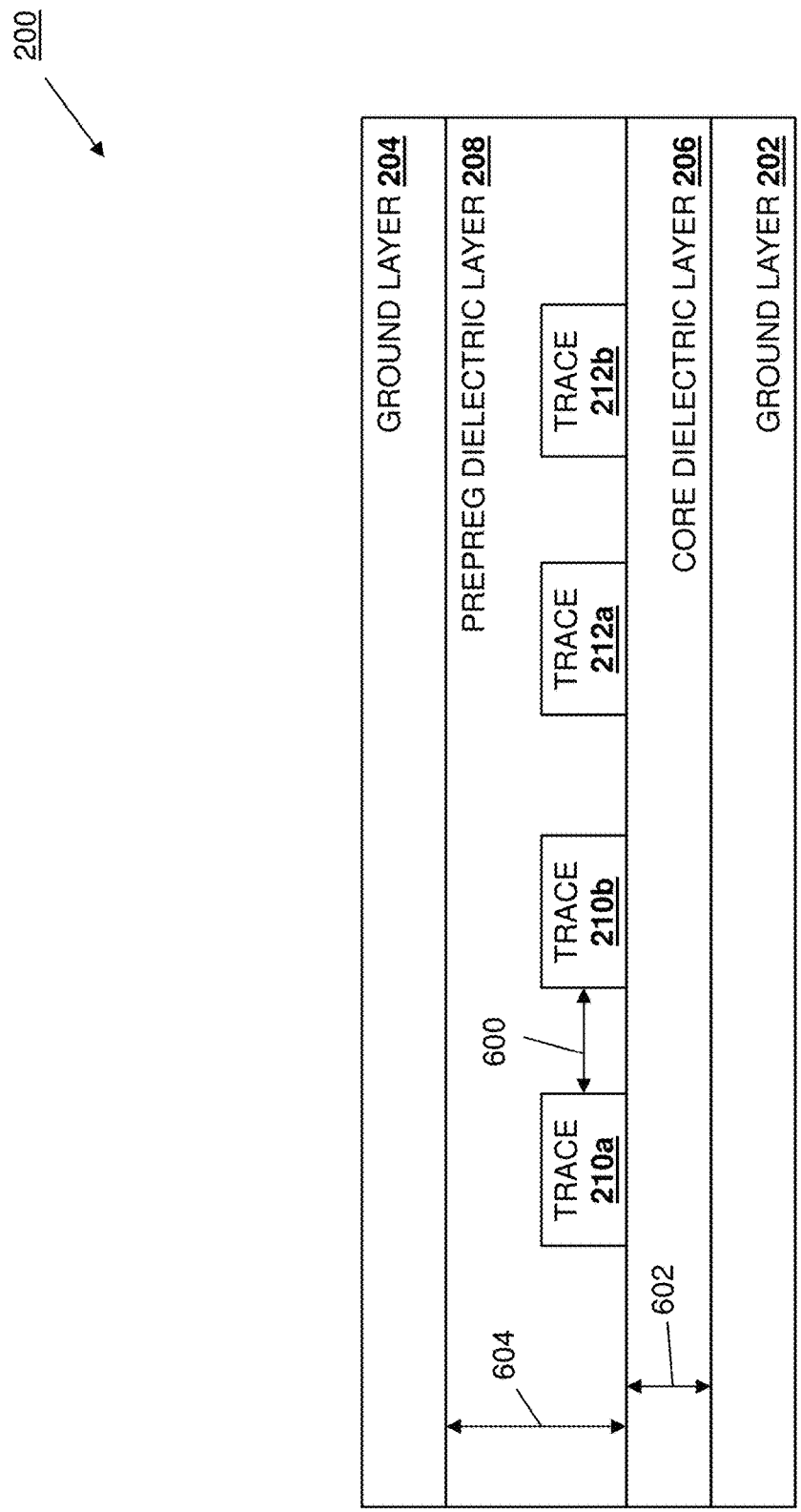
FIG. 6 is a schematic view illustrating an embodiment of the circuit board of FIG. 2 provided with the inhomogeneous dielectric medium high-speed signal trace system of the present disclosure.

The method 500 begins at block 502 where a circuit board is provided with the inhomogeneous dielectric medium high-speed signal trace system of the present disclosure. In an embodiment of block 502, the circuit board 200 may be provided with inhomogeneous dielectric medium high-speed signal trace system of the present disclosure by spacing the traces in the differential trace pairs in the circuit board 200 based on the thickness of the core dielectric layer and the prepreg dielectric layer in the dielectric medium between the ground layers 202 and 204. For example, with reference to FIG. 6, the traces 210a and 210b in the differential trace pair 210 may be provided with a trace spacing 600, which one of skill in the art in possession of the present disclosure will recognize is the distance between those traces 210a and 210b. Furthermore, the core dielectric layer 206 may include a thickness 602, while the prepreg dielectric layer 208 may include a thickness 604, and while the thickness 602 of the core dielectric layer 206 is illustrated in FIG. 6 as being thinner than the thickness 604 of the prepreg dielectric layer 208, one of skill in the art in possession of the present disclosure will appreciate that the thickness 604 of the prepreg dielectric layer 208 may be thinner than the thickness 602 of the core dielectric layer 206 while remaining within the scope of the present disclosure as well.

At block 502, the trace spacing 600 of the traces 210a and 210b in the differential trace pair 210 may be provided such that it is less than or equal to the thinner of 1) the thickness 602 of the core dielectric layer 206 and 2) the thickness 604 of the prepreg dielectric layer 208. In other words, in the illustrated embodiment of FIG. 6 in which the thickness 602 of the core dielectric layer 206 is thinner than the thickness 604 of the prepreg dielectric layer 208, the trace spacing 600 of the traces 210a and 210b in the differential trace pair 210 may be provided such that it is less than or equal to the thickness 602 of the core dielectric layer 206. However, in embodiments in which the thickness 604 of the prepreg dielectric layer 208 is thinner than the thickness 602 of the core dielectric layer 206, the trace spacing 600 of the traces 210a and 210b in the differential trace pair 210 may be provided such that it is less than or equal to the thickness 604 of the prepreg dielectric layer 208. Furthermore, while the spacing of the traces 210a and 210b in the differential trace pair 210 is described as being provided at block 502 above, one of skill in the art in possession of the present disclosure will appreciate that the spacing of the traces 212a and 212b in the differential trace pair 212 (as well as the spacing of other traces in other differential trace pairs) may be provided in a similar manner while remaining within the scope of the present disclosure as well.

The method 500 then proceeds to block 504 where signals are received at the circuit board. In an embodiment, at block 504, data signals may be received at the circuit board 200 via, for example, components mounted to and/or otherwise coupled to the circuit board 200 (e.g., the processing system, memory system, or other components discussed above). In specific examples, the data signals received by the circuit board 200 at block 504 may be generated and transmitted at relatively high frequencies (e.g., 20 GHz and above), and provided to traces in a differential trace pair (e.g., the traces 210a and 210b in the differential trace pair 210 in the example below) that is coupled to the component that generated and provided those data signals to the circuit board 200.

The method 500 then proceeds to block 506 where the signals are transmitted via trace(s) in the circuit board. In an embodiment, at block 506, the traces 210a and 210b in the differential trace pair 210 may operate to transmit the data signals received by the circuit board 200 at block 504 at the relatively high frequencies (e.g., 20 GHz and above) at which they were received. As will be appreciated by one of skill in the art in possession of the present disclosure, the data signals transmitted by the traces 210a and 210b in the differential trace pair 210 at block 506 may include complementary data signals transmitted as a differential pair of signals (e.g., with a respective one of each of the complementary data signals transmitted on each trace 210a and 210b).

Figure 7A:
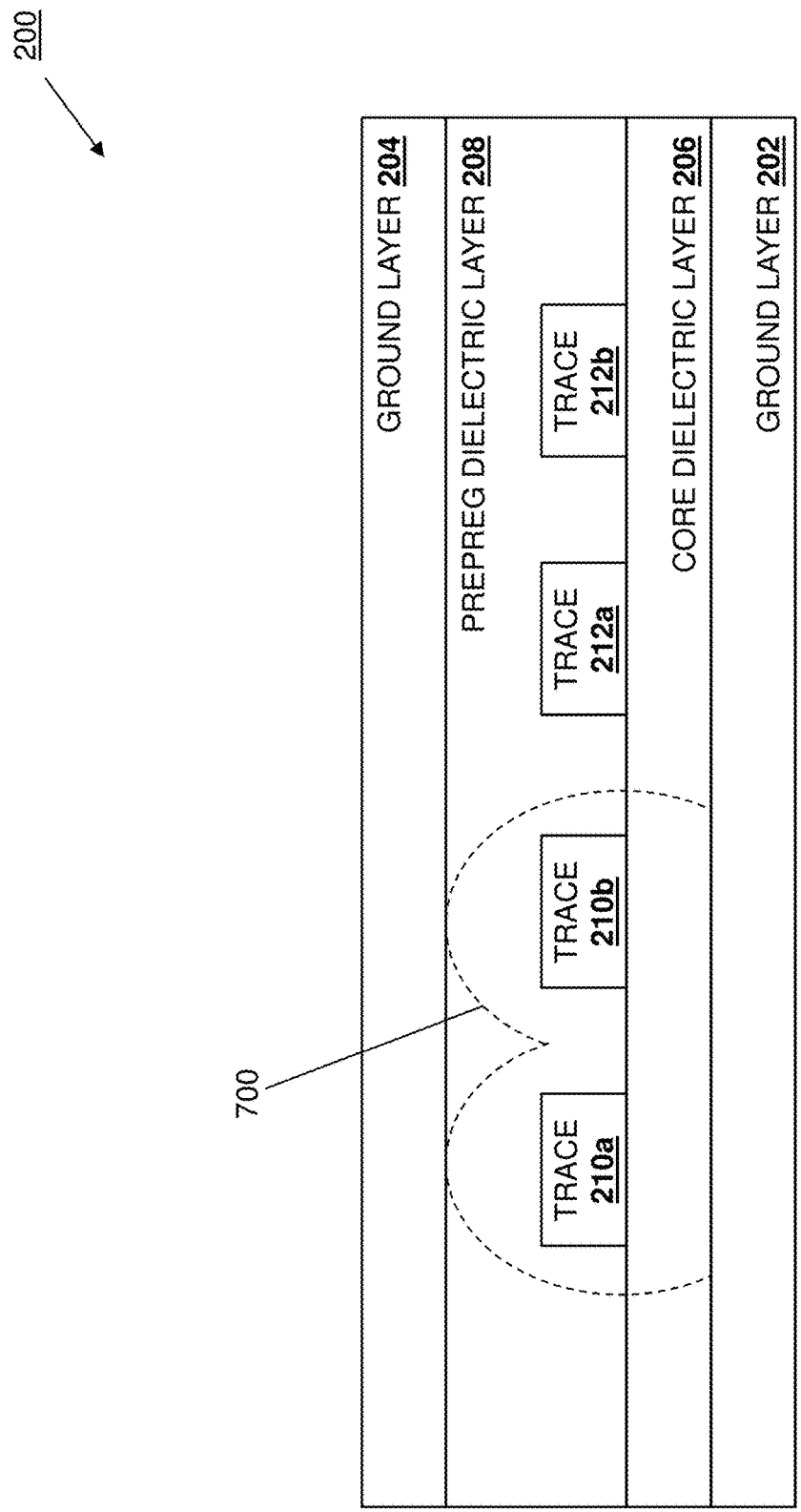
FIG. 7A is a schematic view illustrating an embodiment of the operation of the circuit board of FIG. 6 provided with the inhomogeneous dielectric medium high-speed signal trace system of the present disclosure.

The method 500 then proceeds to block 508 where the trace generates magnetic field(s) having a magnetic field strength that is less than a magnetic field strength threshold. With reference to FIG. 7A, in an embodiment of block 508 and in response to the transmission of the data signals by the traces 210a and 210b in the differential trace pair 210 at block 506, magnetic field(s) 700 will be produced by the traces 210a and 210b in the differential trace pair 210. However, as can be seen in FIG. 7A, despite the inhomogeneous dielectric medium provided by the core dielectric layer 206 and the prepreg dielectric layer 208 and the relatively high speed signals being transmitted by the traces 210a and 210b in the differential trace pair 210, the magnetic field(s) 700 around the traces 210a and 210b are relatively contained in that the strength of those magnetic field(s) reduces below a magnetic field strength threshold at a distance from the traces 210a and 210b (illustrated by a dashed line in FIG. 7) that does not reach the neighboring differential trace pair 212 (e.g., the magnetic field(s) 700 do not have a magnetic field strength above the magnetic field strength threshold at the trace 212a). For example, the spacing between the differential trace pairs 210 and 212 may follow high-speed design rules that provide a spacing of approximately 20-40 mils, although one of skill in the art in possession of the present disclosure will recognize how the system of the present disclosure may be configured to provide the benefits discussed above for differential trace pairs with different spacings while remaining within the scope of the present disclosure.

Figure 7B:
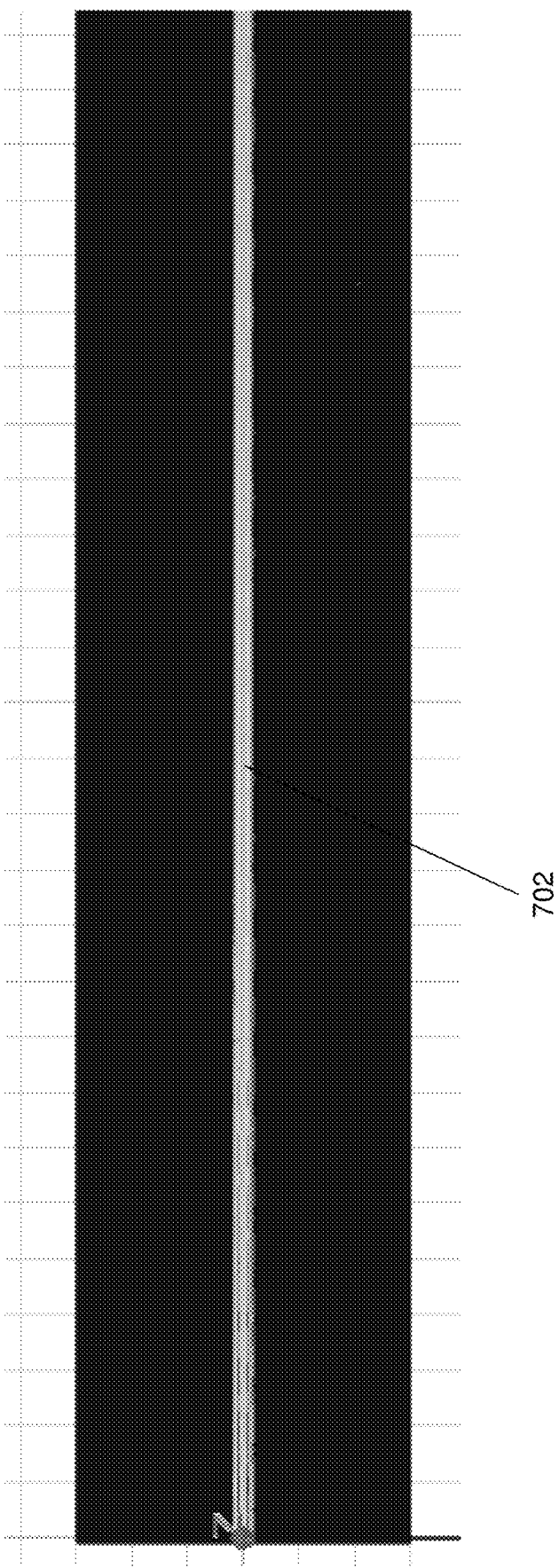
FIG. 7B is a graph view illustrating an embodiment of the operation of the circuit board of FIG. 6 provided with the inhomogeneous dielectric medium high-speed signal trace system of the present disclosure.
Figure 7C:
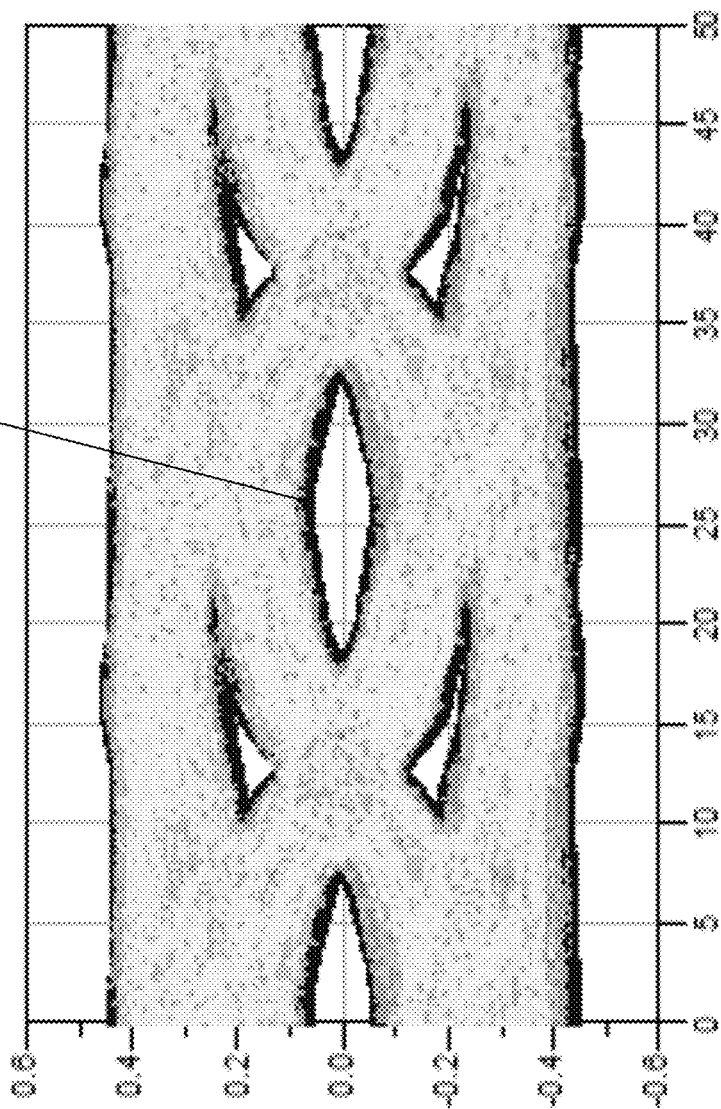
FIG. 7C is a graph view illustrating an embodiment of the operation of the circuit board of FIG. 2 provided with the inhomogeneous dielectric medium high-speed signal trace system of the present disclosure.

Furthermore, FIG. 7B illustrates the magnetic field(s) produced by the differential trace pair 210 in FIG. 7A (with the differential trace pair 210 modeled as running from right to left in FIG. 7B), with a portion 702 of the magnetic field(s) centered around the differential trace pair 210 similarly as in FIG. 4C, but with no portions of the magnetic field(s) uncontained and experiencing "spreading" on either side of the differential trace pair 210 (e.g., with a magnetic field strength that exceeds a magnetic field strength threshold), as occurs with the portions 404b of the magnetic fields discussed above with regard to FIG. 4C. Further still, FIG. 7C illustrates an eye diagram 704 for the trace 212a in FIG. 7A with an eye 704a that one of skill in the art in possession of the present disclosure will recognize shows a clear improvement from the eye 406a in the eye diagram 406 discussed above with reference to FIG. 4D. As such, one of skill in the art in possession of the present disclosure will appreciate that the configuration of the trace spacing in differential trace pairs in a inhomogeneous dielectric medium between a pair of ground layers according to the teachings of the present disclosure can reduce or prevent the excitement of a parallel plate mode in those ground layers when transmitting relatively high speed signals, in turn reducing cross talk noise in neighboring traces and/or other signal integrity issues known in the art.

Thus, systems and methods have been described that provide for the configuration of differential trace pairs in an inhomogeneous dielectric medium between ground layers in a manner that reduces parallel plate mode conversions by those ground layers when relatively high-speed signals are transmitted by those differential trace pairs. For example, the inhomogeneous dielectric medium high-speed signal trace system of the present disclosure may include a first and second ground layer. A first dielectric layer is located adjacent the first ground layer. A second dielectric layer has a different dielectric constant and a greater thickness than the first dielectric layer, and is located between the first dielectric layer and the second ground layer. A first differential trace pair is located between the first dielectric layer and the second dielectric layer, and includes a trace spacing that is less than or equal to a thickness of the first dielectric layer. The first different trace pair transmit signals and, in response, produces a magnetic field, and the trace spacing prevents a magnetic field strength of the magnetic field from exceeding a magnetic field strength threshold at a second differential trace pair that is located adjacent the first differential trace pair. As such, the inhomogeneous dielectric medium high-speed signal trace system of the present disclosure improves high-speed signal performance even in the presence of an inhomogeneous dielectric medium, provides a cost-effective solution to dampen parallel plate mode between ground layers and ensure relatively higher signal quality, reduces crosstalk with neighboring traces, reduces mode conversion that could otherwise result in radiation and other negative side effects, and result in relatively lower insertion losses even in the presence of skew (the impact of which can aggravate parallel plate mode in the ground layers).

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An inhomogeneous dielectric medium high-speed signal trace system, comprising:
    a first ground layer;
    a second ground layer;
    a first dielectric layer having a first dielectric constant, wherein the first dielectric layer is located adjacent the first ground layer and includes a first thickness and;
    a second dielectric layer having a second dielectric constant that is different than the first dielectric constant, wherein the second dielectric layer is located between the first dielectric layer and the second ground layer and includes a second thickness that is greater than or equal to the first thickness;
    a second differential trace pair that is located between the first dielectric layer and the second dielectric layer; and
    a first differential trace pair that is located between the first dielectric layer and the second dielectric layer and adjacent the second differential trace pair, wherein the first differential trace pair is configured to transmit signals and, in response, produce a magnetic field, and wherein the first differential trace pair includes a trace spacing that is less than or equal to the first thickness and that prevents a magnetic field strength of the magnetic field from exceeding a magnetic field strength threshold at the second differential trace pair.

2. The system of claim 1, wherein the first dielectric layer is a core dielectric layer and the second dielectric layer is a prepreg dielectric layer.

3. The system of claim 1, wherein the first dielectric layer is a prepreg dielectric layer and the second dielectric layer is a core dielectric layer.

4. The system of claim 1, wherein the first dielectric trace pair and the second dielectric trace pair are spaced apart by between 20 and 40 mils.

5. The system of claim 1, wherein the signals are transmitted at a frequency of at least 20 GHz.

6. The system of claim 1, wherein the first dielectric layer includes a first resin and a first glass percentage, and wherein the second dielectric layer includes a second resin that is different than the first resin and a second glass percentage that is different than the first glass percentage.

7. An Information Handling System (IHS), comprising:
    a chassis;
    a processing system that is housed in the chassis; and
    a board that is housed in the chassis and that supports the processing system, wherein the board includes:
        a first ground layer;
        a second ground layer;
        a first dielectric layer having a first dielectric constant, wherein the first dielectric layer is located adjacent the first ground layer and includes a first thickness and;
        a second dielectric layer having a second dielectric constant that is different than the first dielectric constant, wherein the second dielectric layer is located between the first dielectric layer and the second ground layer and includes a second thickness that is greater than or equal to the first thickness;
        a second differential trace pair that is coupled to the processing system and that is located between the first dielectric layer and the second dielectric layer; and
        a first differential trace pair that is coupled to the processing system, and that is located between the first dielectric layer and the second dielectric layer and adjacent the first differential trace pair, wherein the first differential trace pair is configured to transmit signals and, in response, produce a magnetic field, and wherein the first differential trace pair includes a trace spacing that is less than or equal to the first thickness and that prevents a magnetic field strength of the magnetic field from exceeding a magnetic field strength threshold at the second differential trace pair.

8. The IHS of claim 7, wherein the first dielectric layer is a core dielectric layer and the second dielectric layer is a prepreg dielectric layer.

9. The IHS of claim 7, wherein the first dielectric layer is a prepreg dielectric layer and the second dielectric layer is a core dielectric layer.

10. The IHS of claim 7, wherein the first dielectric trace pair and the second dielectric trace pair are spaced apart by between 20 and 40 mils.

11. The IHS of claim 7, wherein the signals are transmitted at a frequency of at least 20 GHz.

12. The IHS of claim 7, wherein the first dielectric layer includes a first resin and a first glass percentage, and wherein the second dielectric layer includes a second resin that is different than the first resin and a second glass percentage that is different than the first glass percentage.

13. The IHS of claim 7, further comprising:
a memory system that is housed in the chassis, supported by the board, and coupled to the processing system by the first differential trace pair.

14. A method for providing high speed signals via stripline traces in an inhomogeneous dielectric medium, comprising:
receiving, at a board that includes a pair of ground layers and a pair of dielectric layers that are located between the pair of ground layers and that each include a different dielectric constant, signals;
transmitting, by a first differential trace pair that is located between the pair of dielectric layers in the board and that includes a trace spacing that is less than a thinnest of the pair of dielectric layers, the signals;
generating, by the first differential trace pair in response to transmitting the signals and based on the trace spacing that is less than the thinnest of the pair of dielectric layers, a magnetic field having a magnetic field strength that is less than a magnetic field strength threshold at a second differential trace pair that is located between the pair of dielectric layers in the board and adjacent the first differential trace pair.

15. The method of claim 14, wherein the pair of dielectric layers include a core dielectric layer and a prepreg dielectric layer, and wherein the core dielectric layer is thinner than the prepreg dielectric layer.

16. The method of claim 14, wherein the pair of dielectric layers include a prepreg dielectric layer and a core dielectric layer, and wherein the prepreg dielectric layer is thinner than the core dielectric layer.

17. The method of claim 14, wherein the first dielectric trace pair and the second dielectric trace pair are spaced apart by between 20 and 40 mils.

18. The method of claim 14, wherein the signals are transmitted at a frequency of at least 20 GHz.

19. The method of claim 14, wherein the pair of dielectric layers include a first dielectric layer including a first resin and a first glass percentage, and a second dielectric layer including a second resin that is different than the first resin and a second glass percentage that is different than the first glass percentage.

20. The method of claim 14, further comprising:
a processing system that is mounted to the board; and
a memory system that is mounted to the board and coupled to the processing system by the first differential trace pair.

* * * * *